(12) United States Patent
Kim et al.

(10) Patent No.: US 11,165,044 B2
(45) Date of Patent: Nov. 2, 2021

(54) DISPLAY DEVICE

(71) Applicant: SAMSUNG DISPLAY CO., LTD., Yongin-si (KR)

(72) Inventors: Yi Su Kim, Seoul (KR); Young Gu Kim, Yongin-si (KR); Chang Yeong Song, Suwon-si (KR); Hye In Yang, Siheung-si (KR); Woo Suk Jung, Yongin-si (KR); Yong Chan Ju, Yongin-si (KR); Jae Heung Ha, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/934,122

(22) Filed: Jul. 21, 2020

(65) Prior Publication Data
US 2021/0175471 A1 Jun. 10, 2021

(30) Foreign Application Priority Data
Dec. 6, 2019 (KR) .................. 10-2019-0161694

(51) Int. Cl.
*G06F 3/044* (2006.01)
*H01L 51/52* (2006.01)
*H01L 27/32* (2006.01)
*G06F 3/041* (2006.01)

(52) U.S. Cl.
CPC ........ *H01L 51/5253* (2013.01); *G06F 3/0412* (2013.01); *G06F 3/0443* (2019.05); *G06F 3/0446* (2019.05); *H01L 27/323* (2013.01); *H01L 51/5256* (2013.01); *G06F 2203/04102* (2013.01); *H01L 27/3244* (2013.01)

(58) Field of Classification Search
CPC ......... G06F 2203/04102; G06F 3/0412; G06F 3/0443; G06F 3/0446; H01L 27/323; H01L 27/3244; H01L 51/5253; H01L 51/5256
USPC .................................................. 345/170–178
See application file for complete search history.

(56) References Cited

U.S. PATENT DOCUMENTS

| | | | |
|---|---|---|---|
| 2015/0372070 A1* | 12/2015 | Yoon | H01L 27/3258 257/40 |
| 2017/0063374 A1* | 3/2017 | Yamamoto | H01L 51/0097 |
| 2018/0246581 A1* | 8/2018 | Omata | H01L 27/323 |
| 2018/0373372 A1* | 12/2018 | Kim | H01L 51/5253 |

(Continued)

FOREIGN PATENT DOCUMENTS

| KR | 10-1141956 | 4/2012 |
|---|---|---|
| KR | 10-1623771 | 5/2016 |

(Continued)

*Primary Examiner* — Tony O Davis
(74) *Attorney, Agent, or Firm* — F. Chau & Associates, LLC

(57) ABSTRACT

A display device may include a substrate and a light emitting element disposed on the substrate. An encapsulation layer covers the light emitting element. The encapsulation layer includes at least two inorganic encapsulation layers and at least one organic encapsulation layer. The at least one organic encapsulation layer includes a first organic material having a permittivity less than or equal to about 3.0. A low permittivity layer is disposed on the encapsulation layer. The low permittivity layer includes a second organic material and first hollow particles dispersed in the second organic material. An input sensing layer is disposed on the low permittivity layer.

22 Claims, 9 Drawing Sheets

(56) References Cited

U.S. PATENT DOCUMENTS

| | | | | |
|---|---|---|---|---|
| 2019/0095018 A1* | 3/2019 | Shin | ................... | G06F 3/04164 |
| 2019/0189722 A1* | 6/2019 | Lim | ................... | H01L 27/3276 |
| 2019/0189975 A1* | 6/2019 | Lim | ................... | H01L 27/3258 |
| 2019/0237533 A1* | 8/2019 | Kim | ................... | G06F 3/04164 |
| 2019/0280076 A1* | 9/2019 | Bang | ................... | H01L 27/3265 |
| 2020/0167037 A1* | 5/2020 | Lee | ................... | G06F 3/0445 |
| 2020/0167038 A1* | 5/2020 | Lee | ................... | G06F 3/0448 |
| 2020/0168681 A1* | 5/2020 | Jeon | ................... | H01L 51/56 |
| 2020/0335713 A1* | 10/2020 | Song | ................... | H01L 27/3244 |
| 2020/0388653 A1* | 12/2020 | Lee | ................... | G06F 3/044 |
| 2021/0028395 A1* | 1/2021 | Kim | ................... | H01L 27/323 |

FOREIGN PATENT DOCUMENTS

| | | |
|---|---|---|
| KR | 10-2018-0134848 | 12/2018 |
| KR | 10-20190047592 | 5/2019 |
| KR | 10-2019-0073061 | 6/2019 |

* cited by examiner

DISPLAY DEVICE

CROSS-REFERENCE TO RELATED APPLICATION(S)

This application claims priority under 35 U.S.C. § 119 to Korean Patent Application No. 10-2019-0161694, filed on Dec. 6, 2019 in the Korean Intellectual Property Office, the disclosure of which is incorporated by reference in its entirety herein.

1. TECHNICAL FIELD

The present inventive concepts relate to a display device. More particularly, the present inventive concepts relate to a display device including an input sensing layer.

2. DISCUSSION OF RELATED ART

A display device, such as a liquid crystal display device, an organic light emitting display device, an electrophoretic display device, or the like, may include electric field generating electrodes and an electro-optical active layer formed therebetween. For example, an organic light emitting display device may include a light emitting element having an organic light emitting layer as the electro-optical active layer.

The lifespan of an electrical element included in the display device may decrease when impurities such as gas, moisture or other contaminants flow into the display device from outside which may damage the electrical elements. The light efficiency of the organic light emitting layer may also decrease when impurities flow into the organic light emitting display device. An encapsulation layer may be formed on the light emitting element to shield the light emitting element from impurities from the outside.

An input sensing sensor which may receive a touch input from a body part of the user, an instrument, such as a pen, etc. may be used as an input device of the display device. In recent technological developments, an input sensing layer may be formed on the encapsulation layer to decrease a thickness of the display device.

However, when the distance between the input sensing layer and the light emitting element decreases due to a reduced thickness of the encapsulation layer, a parasitic capacitance formed between an electrode of the light emitting and a sensing electrode of the input sensing layer may increase. The sensitivity of the input sensing layer may decrease due to the parasitic capacitance formed between the electrode of the light emitting and the sensing electrode of the input sensing layer.

SUMMARY

Exemplary embodiments of the present inventive concepts provide a display device in which a sensitivity of an input sensing layer is improved.

A display device according to an exemplary embodiment of the present inventive concepts may include a substrate and a light emitting element disposed on the substrate. An encapsulation layer covers the light emitting element. The encapsulation layer includes at least two inorganic encapsulation layers and at least one organic encapsulation layer. The at least one organic encapsulation layer includes a first organic material having a permittivity less than or equal to about 3.0. A low permittivity layer is disposed on the encapsulation layer. The low permittivity layer includes a second organic material and first hollow particles dispersed in the second organic material. An input sensing layer is disposed on the low permittivity layer.

In an exemplary embodiment, a permittivity of the low permittivity layer may be less than or equal to about 3.0.

In an exemplary embodiment, a mass ratio of the first hollow particles to a total mass of the low permittivity layer may be about 10% to about 50%.

In an exemplary embodiment, the first hollow particles may include at least one of silica ($SiO_2$), magnesium fluoride ($MgF_2$), and iron oxide ($Fe_3O_4$).

In an exemplary embodiment, a diameter of each of the first hollow particles may be about 20 nm to about 200 nm.

In an exemplary embodiment, the second organic material may be substantially the same as the first organic material.

In an exemplary embodiment, the second organic material may be different from the first organic material.

In an exemplary embodiment, the second organic material may be a photocurable material.

In an exemplary embodiment, the low permittivity layer may further include a photoinitiator.

In an exemplary embodiment, the second organic material may be a thermosetting material.

In an exemplary embodiment, the low permittivity layer may further include a thermostabilizer.

In an exemplary embodiment, a permittivity of the first organic material may be less than a permittivity of the second organic material.

In an exemplary embodiment, the organic encapsulation layer may further include second hollow particles dispersed in the first organic material.

In an exemplary embodiment, a sum of a thickness of the organic encapsulation layer and a thickness of the low permittivity layer may be about 4 μm to about 15 μm.

In an exemplary embodiment, the light emitting element may include a first electrode disposed on the substrate, an emission layer disposed on the first electrode, and a second electrode disposed on the emission layer.

In an exemplary embodiment, the input sensing layer may include a first sensing electrode and a second sensing electrode insulated from each other.

A display device according to an exemplary embodiment may include a substrate and a light emitting element disposed on the substrate. An encapsulation layer covers the light emitting element. The encapsulation layer includes at least two inorganic encapsulation layers and at least one organic encapsulation layer. The at least one organic encapsulation layer includes a first organic material and hollow particles dispersed in the first organic material. A low permittivity layer is disposed on the encapsulation layer. The low permittivity layer includes a second organic material having a permittivity less than or equal to about 3.0. An input sensing layer is disposed on the low permittivity layer.

In an exemplary embodiment, a permittivity of the organic encapsulation layer may be less than or equal to about 3.0.

In an exemplary embodiment, a permittivity of the second organic material may be less than a permittivity of the first organic material.

A display device according to an exemplary embodiment may include a substrate and a light emitting element disposed on the substrate. An encapsulation layer covers the light emitting element. The encapsulation layer includes at least two inorganic encapsulation layers and at least one organic encapsulation layer. The at least one organic encapsulation layer includes a first organic material having a permittivity less than or equal to about 3.0. A low permittivity layer is disposed on the encapsulation layer. The low permittivity layer includes a second organic material having a permittivity less than or equal to about 3.0. An input sensing layer is disposed on the low permittivity layer.

A display device according to an exemplary embodiment includes a substrate and a light emitting element disposed on the substrate. An encapsulation layer covers the light emitting element. The encapsulation layer includes at least two inorganic encapsulation layers and at least one organic encapsulation layer. The at least one organic encapsulation layer includes a first organic material having a permittivity greater than about 3.0 and first hollow particles dispersed in the first organic material. A low permittivity layer is disposed on the encapsulation layer. The low permittivity layer includes a second organic material having a permittivity greater than about 3.0 and second hollow particles dispersed in the second organic material. An input sensing layer is disposed on the low permittivity layer. The encapsulation layer and the low permittivity layer each have a permittivity less than or equal to about 3.0.

In the display device according to the exemplary embodiments, the encapsulation layer may include the organic encapsulation layer that includes organic material having a permittivity less than or equal to about 3.0 or hollow particles dispersed in the organic material, and the low permittivity layer including hollow particles dispersed in organic material or the organic material having a permittivity less than or equal to about 3.0 may be disposed on the encapsulation layer. Accordingly, a parasitic capacitance between the light emitting element and the input sensing layer may decrease, and sensitivity of the input sensing layer may be improved.

BRIEF DESCRIPTION OF THE DRAWINGS

Illustrative, non-limiting exemplary embodiments of the present inventive concepts will be more clearly understood from the following detailed description of exemplary embodiments taken in conjunction with the accompanying drawings.

DETAILED DESCRIPTION OF EXEMPLARY EMBODIMENTS

Hereinafter, display devices in accordance with exemplary embodiments of the present inventive concepts will be explained in detail with reference to the accompanying drawings.

Figure 1:
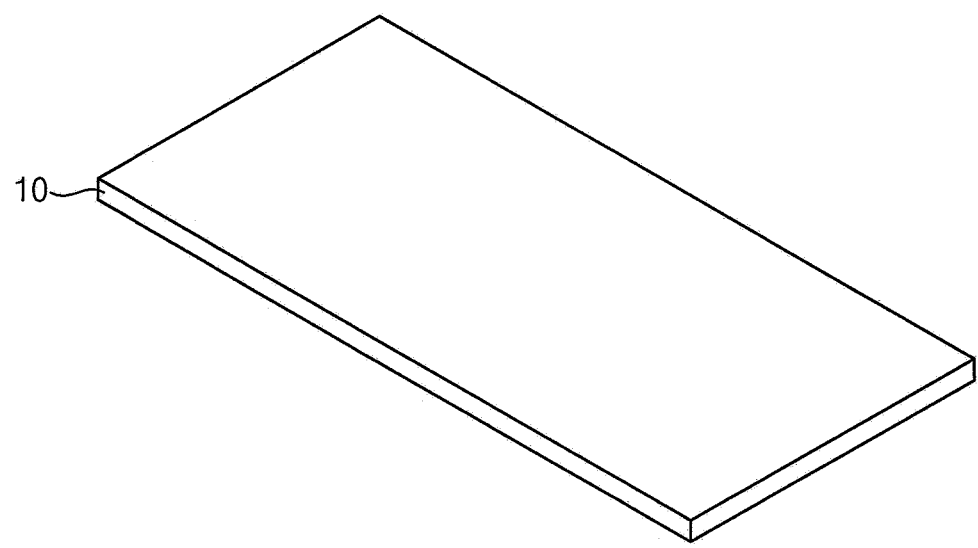
FIGS. 1 and 2 are perspective views illustrating a display device in a folded state and unfolded state, respectively, according to exemplary embodiments of the present inventive concepts.
Figure 2:
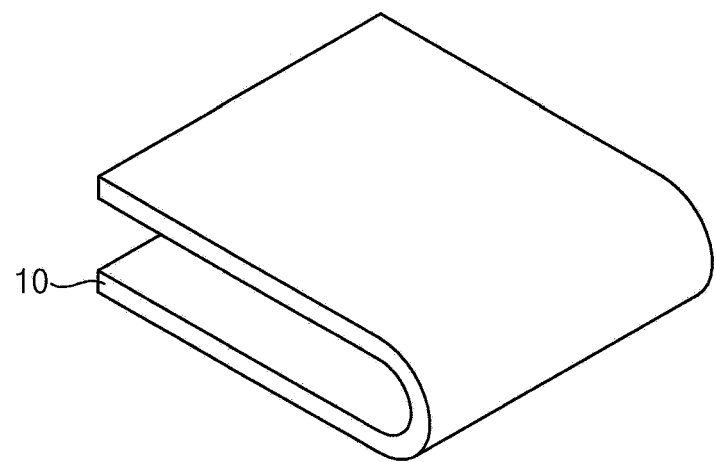

FIGS. 1 and 2 are perspective views illustrating a display device 10 in a folded state and an unfolded state, according to exemplary embodiments of the present inventive concepts.

Referring to FIGS. 1 and 2, a display device 10 according to an exemplary embodiment may be a flexible display device. For example, the display device 10 may be a foldable display device. The display device 10 may be in an unfolded state as illustrated in FIG. 1, or may be in a folded state as illustrated in FIG. 2. However, exemplary embodiments of the present inventive concepts are not limited thereto. For example, in other exemplary embodiments, the display device 10 may be a bendable display device, a rollable display device, etc. In another exemplary embodiment, the display device 10 may not be flexible.

Figure 3:
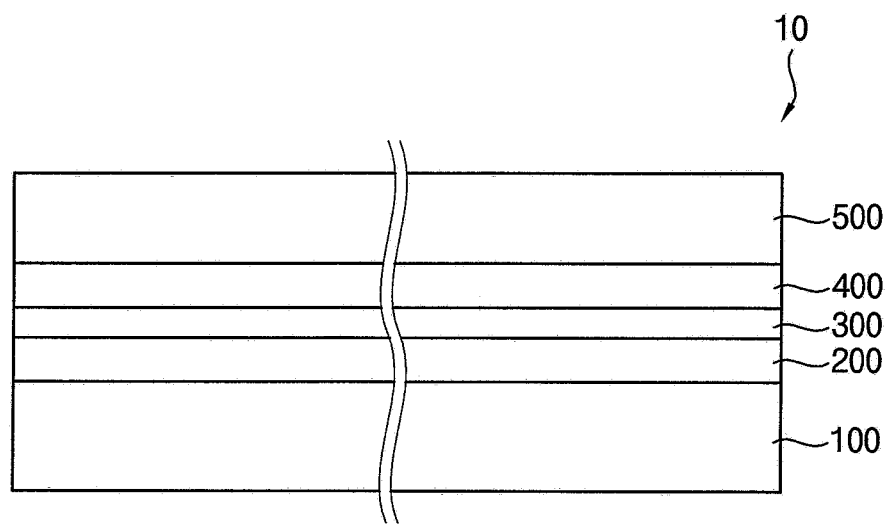
FIG. 3 is a cross-sectional view illustrating a display device according to an exemplary embodiment of the present inventive concepts.

FIG. 3 is a cross-sectional view illustrating the display device 10 according to an exemplary embodiment of the present inventive concepts.

Referring to the exemplary embodiment of FIG. 3, the display device 10 may include a display panel 100, an encapsulation layer 200, a low permittivity layer 300, an input sensing layer 400, and a window 500. As shown in the exemplary embodiment of FIG. 3, the display panel 100, the encapsulation layer 200, the low permittivity layer 300, the input sensing layer 400 and the window 500 may be consecutively stacked on each other (e.g., in a thickness direction of the display device 10). As described above, the display device 10 may be folded or unfolded, so that the display panel 100, the encapsulation layer 200, the low permittivity layer 300, the input sensing layer 400, and the window 500 may have flexibility.

The display panel 100 may generate an image for providing visual information to a user. The display panel 100 may display the image in a direction toward the window 500. While the window 500 is shown in the exemplary embodiment of FIG. 3 as being positioned on a top surface of the display device 10 and the display device 10 is a front emitting display device, exemplary embodiments of the present inventive concepts are not limited thereto. For example, in other exemplary embodiments, the display device 10 may be a rear emitting display device or a display device which displays an image on both the front and rear surfaces.

The encapsulation layer 200 may be disposed on the display panel 100. For example, as shown in the exemplary embodiment of FIG. 3, a lower surface of the encapsulation layer 200 may directly contact an upper surface of the display panel 100. The encapsulation layer 200 may cover an upper portion of the display panel 100 to protect the display panel 100 from impurities such as gas, moisture, etc. from outside.

The input sensing layer 400 may be disposed on the encapsulation layer 200. The input sensing layer 400 may sense an external input such as an external object that touches or approaches the display device 10. For example, the input sensing layer 400 may sense the external input by using a capacitive scheme.

The low permittivity layer 300 may be disposed between the encapsulation layer 200 and the input sensing layer 400 (e.g., in a thickness direction of the display device 10). The low permittivity layer 300 may reduce noise applied to the input sensing layer 400 due to electromagnetic interaction between the display panel 100 and the input sensing layer 400. Accordingly, the sensitivity of the input sensing layer 400 may be improved.

The window 500 may be disposed on the input sensing layer 400. For example, as shown in the exemplary embodiment of FIG. 3, a lower surface of the window 500 may directly contact an upper surface of the input sensing layer 400. The window 500 may protect the display panel 100, the encapsulation layer 200, the low permittivity layer 300, and the input sensing layer 400 from external impacts, and may provide a display surface for the image generated by the display panel 100 of the display device 10. In an exemplary embodiment, the window 500 may include at least one material selected from glass, a polymer resin such as polycarbonate (PC), polymethyl methacrylate (PMMA), polyarylate (PAR), polyethersulfone (PES), polyethylene terephthalate (PET), and/or polyethylene naphthalate (PEN), or the like.

Figure 4:
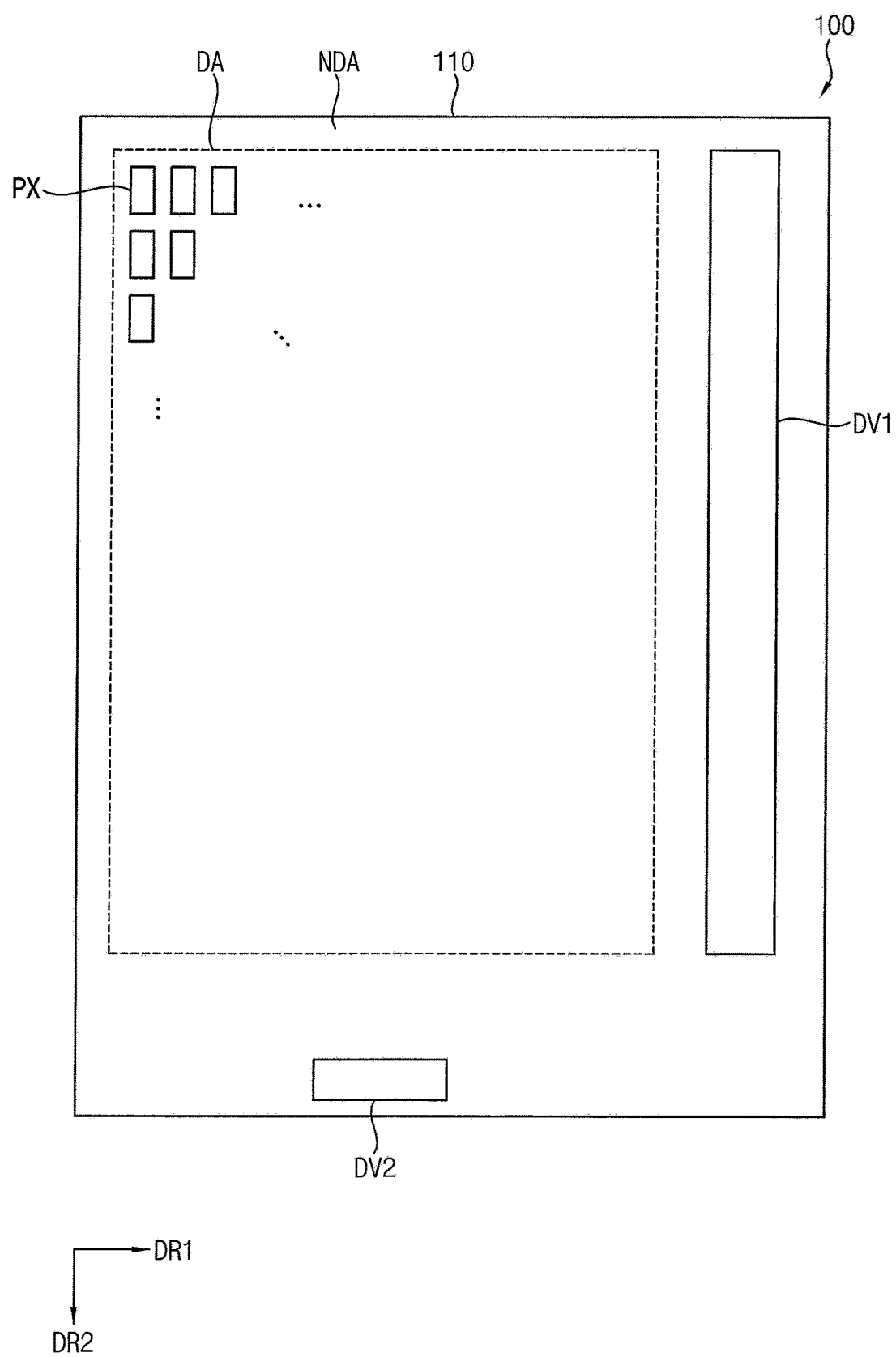
FIG. 4 is a plan view illustrating the display panel of the display device shown in FIG. 3 according to an exemplary embodiment of the present inventive concepts.

FIG. 4 is a plan view illustrating the display panel 100 in FIG. 3 according to an exemplary embodiment of the present inventive concepts.

Referring to the exemplary embodiment of FIG. 4, the display panel 100 may include a substrate 110 including a display area DA and a non-display area NDA. A plurality of pixels PX may be disposed on the substrate 110 in the display area DA. In an exemplary embodiment, the pixels PX may be arranged in a substantial matrix form along a first direction DR1 and a second direction DR2 crossing the first direction DR1. The first direction DR1 and the second direction DR2 may be parallel to an upper surface of the substrate 110. For example, as shown in the exemplary embodiment of FIG. 4, the first direction DR1 may be perpendicular to the second direction DR2. However, exemplary embodiments of the present inventive concepts are not limited thereto. Each of the pixels PX may emit light, and an image formed by the light emitted from each of the pixels PX may be displayed in the display area DA.

The non-display area NDA may be positioned on at least one side of the display area DA. For example, as shown in the exemplary embodiment of FIG. 4, the display area DA may be substantially rectangular shaped and the non-display area NDA may surround the display area DA on all four sides (e.g., in the first direction DR1 and the second direction DR2). However, in other exemplary embodiments, the display area DA may extend to at least one edge of the substrate 110 and the non-display area DA may be disposed on three or less sides of the display area DA. The shape of the display area DA is not limited to the shape shown in the exemplary embodiment of FIG. 4 and the display area DA may have a variety of different shapes. In an exemplary embodiment, a first driver DV1 and a second driver DV2 may be disposed on the substrate 110 in the non-display area NDA. For example, as shown in the exemplary embodiment of FIG. 4, the first driver DV1 may be positioned on a right side of the non-display area NDA which is spaced apart from the display area DA in the first direction DR1 and the second driver DV2 may be positioned on a lower side of the non-display area NDA which is spaced apart from the display area DA in the second direction DR2. However, exemplary embodiments of the present inventive concepts are not limited thereto.

In an exemplary embodiment, the first driver DV1 may be a scan driver providing scan signals to the pixels PX, and the second driver DV2 may be a data driver providing data signals to the pixels PX. In this exemplary embodiment, the first driver DV1 may be connected to the pixels PX through scan lines extending along the first direction DR1, and the second driver DV2 may be connected to the pixels PX through data lines extending along the second direction DR2.

Figure 5:
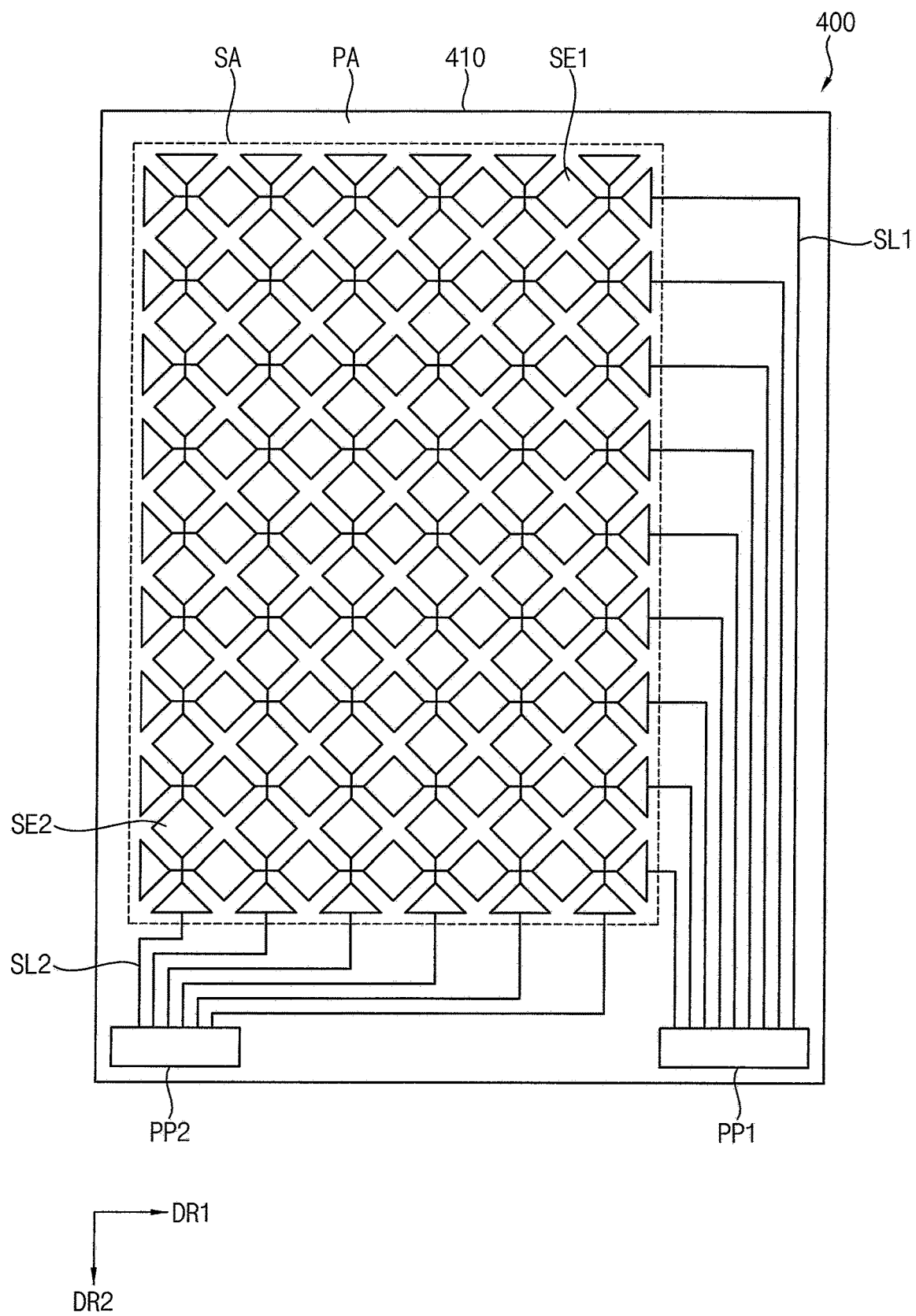
FIG. 5 is a plan view illustrating the input sensing layer of the display device shown in FIG. 3 according to an exemplary embodiment of the present inventive concepts.

FIG. 5 is a plan view illustrating the input sensing layer 400 in FIG. 3 according to an exemplary embodiment of the present inventive concepts.

Referring to the exemplary embodiment of FIG. 5, the input sensing layer 400 may include a base layer 410 including a sensing area SA and a peripheral area PA. In an exemplary embodiment, the sensing area SA may overlap the display area DA (e.g., in a thickness direction of the substrate 110). In an exemplary embodiment, the area (e.g., in a plane defined by the first direction DR1 and the second direction DR2) of the sensing area SA may be greater than or substantially equal to the area (e.g., in a plane defined by the first direction DR1 and the second direction DR2) of the display area DA.

A plurality of first sensing electrodes SE1 and a plurality of second sensing electrodes SE2 may be disposed on the base layer 410 in the sensing area SA. In an exemplary embodiment, each of the first sensing electrodes SE1 may extend along the first direction DR1, and the first sensing electrodes SE1 may be arranged along the second direction DR2. Further, each of the second sensing electrodes SE2 may extend along the second direction DR2, and the second sensing electrodes SE2 may be arranged along the first direction DR. The second sensing electrodes SE2 may cross the first sensing electrodes SE1 and may be insulated therefrom.

The peripheral area PA may be positioned on at least one side of the sensing area SA. For example, as shown in the exemplary embodiment of FIG. 5, the sensing area SA may be substantially rectangular shaped and the peripheral area PA may surround the sensing area SA on all four sides (e.g., in the first direction DR1 and second direction DR2). However, exemplary embodiments of the present inventive concepts are not limited thereto and the shape of the sensing area SA and the number of sides that the peripheral area PA is positioned thereon may vary. In an exemplary embodiment, the peripheral area PA may overlap the non-display area NDA (e.g., in the thickness direction of the substrate 110).

A plurality of first sensing lines SL1, a plurality of second sensing lines SL2, a first pad portion PP1, and a second pad portion PP2 may be disposed on the base layer 410 in the peripheral area PA. As shown in the exemplary embodiment of FIG. 5, the first sensing lines SL1 may connect the first sensing electrodes SE1 to the first pad portion PP1, and the second sensing lines SL2 may connect the second sensing electrodes SE2 to the second pad portion PP2. The first sensing lines SL1 may transmit first sensing input signals from the first pad portion PP1 to the first sensing electrodes SE1, or may transmit first sensing output signals from the first sensing electrodes SE1 to the first pad portion PP1. The second sensing lines SL2 may transmit second sensing input signals from the second pad portion PP2 to the second sensing electrodes SE2, or may transmit second sensing output signals from the second sensing electrodes SE2 to the second pad portion PP2.

The first sensing electrodes SE1 and the second sensing electrodes SE2 may sense an input event to the input sensing layer 400 through a body part of the user, such as the users hand or finger, or by other input means. In an exemplary embodiment, the first sensing electrodes SE1 and the second sensing electrodes SE2 may be driven with a mutual capacitance method. However, exemplary embodiments of the present inventive concepts are not limited thereto. The mutual capacitance method is a method of sensing a change in capacitance due to the interaction between two sensing electrodes.

Figure 6:
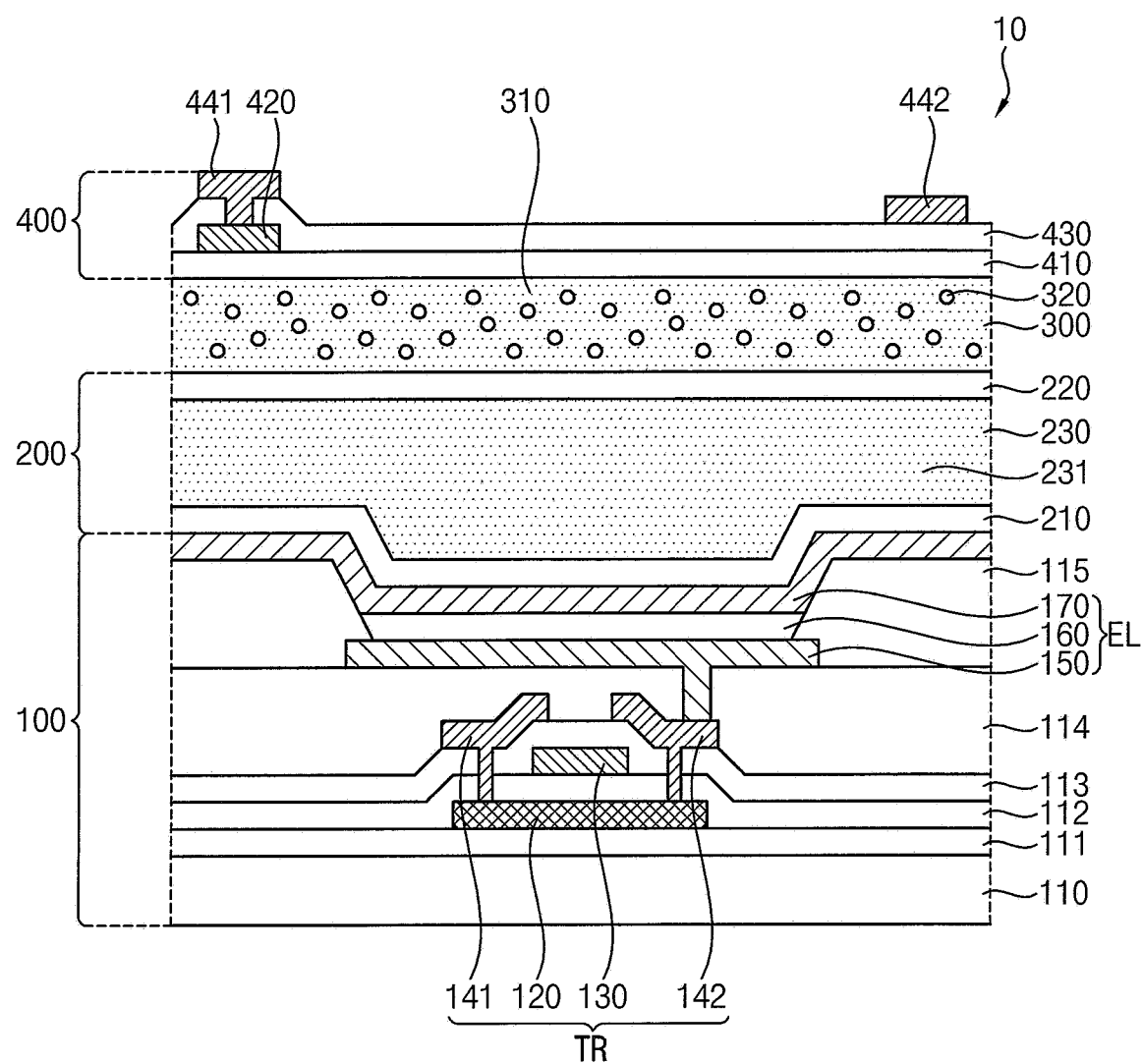
FIG. 6 is a cross-sectional view illustrating a display device according to an exemplary embodiment of the present inventive concepts.
Figure 7:
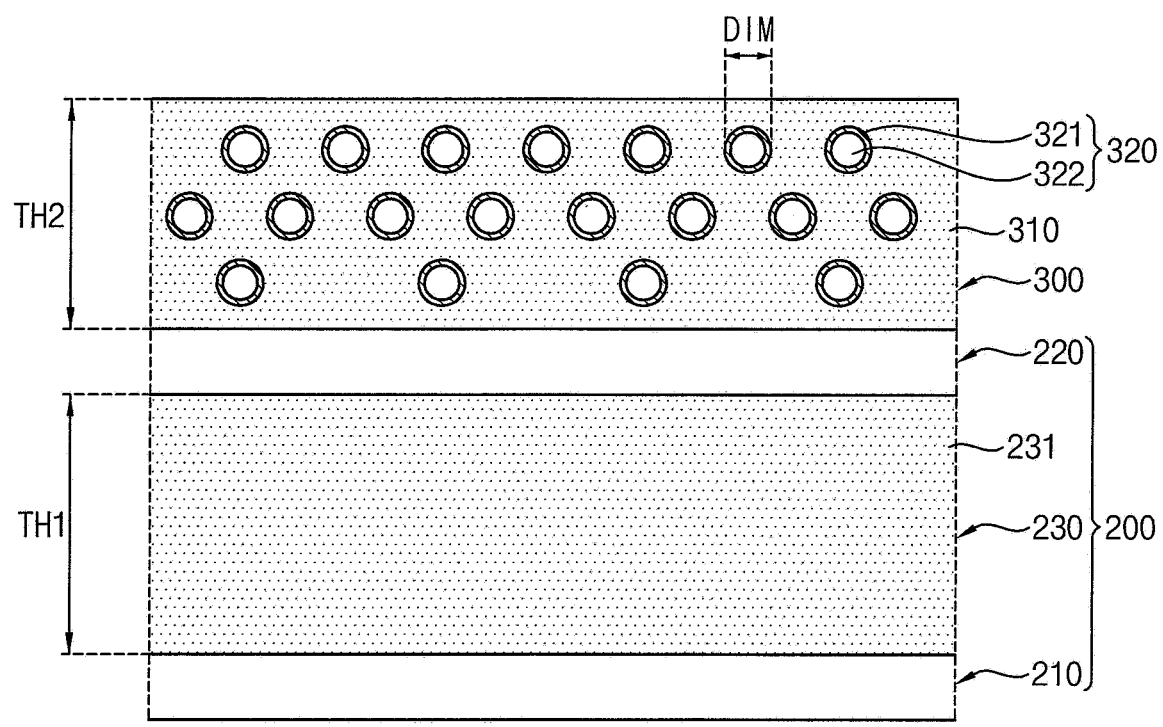
FIG. 7 is an enlarged cross-sectional view illustrating an encapsulation layer and a low permittivity layer of the display device shown in FIG. 6 according to an exemplary embodiment of the present inventive concepts.

FIG. 6 is a cross-sectional view illustrating a display device 10 according to an exemplary embodiment of the present inventive concepts. FIG. 7 is a cross-sectional view illustrating an encapsulation layer and a low permittivity layer in FIG. 6 according to an exemplary embodiment of the present inventive concepts.

Referring to the exemplary embodiments of FIGS. 6 and 7, the display device 10 may include a display panel 100, an encapsulation layer 200, a low permittivity layer 300, and an input sensing layer 400.

The display panel 100 may include a substrate 110. A transistor TR and a light emitting element EL are disposed on the substrate 110. As shown in the exemplary embodiment of FIG. 6, the transistor TR may include an active layer 120, a gate electrode 130, a first electrode 141, and a second electrode 142. In an exemplary embodiment, the transistor TR may provide a driving signal, such as a driving current, to the light emitting element EL. The light emitting element EL may include a first electrode 150, an emission layer 160, and a second electrode 170. The light emitting element EL may emit light based on the driving signal provided from the transistor TR.

In an exemplary embodiment, the substrate 110 may be formed of flexible material. For example the flexible material may include at least one compound selected from polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), cellulose acetate propionate (CAP), and the like. In another exemplary embodiment, the substrate 110 may be formed of a rigid material and the display device 10 may not be flexible. For example, the rigid material may include at least one material selected from glass, quartz, and the like.

A buffer layer 111 may be disposed on the substrate 110. For example, as shown in the exemplary embodiment of FIG. 6, a lower surface of the buffer layer 111 may directly contact an upper surface of the substrate 110. The buffer layer 111 may block impurities from permeating through the substrate 110. Further, the buffer layer 111 may provide a planarized surface above the substrate 110. In an exemplary embodiment, the buffer layer 111 may include an inorganic insulating material such as at least one compound selected from silicon nitride ($SiN_x$), silicon oxide ($SiO_x$), silicon oxynitride ($SiO_xN_y$), and the like.

The active layer 120 may be disposed on the buffer layer 111. For example, as shown in the exemplary embodiment of FIG. 6, a lower surface of the active layer 120 may directly contact an upper surface of the buffer layer 111. In an exemplary embodiment, the active layer 120 may be formed of at least one material selected from amorphous silicon, polycrystalline silicon, and the like. In another exemplary embodiment, the active layer 120 may be formed of at least one material selected from an oxide semiconductor, metal oxide, and the like. The active layer 120 may include a source region, a drain region, and a channel region disposed therebetween. The source region and the drain region may be doped with P-type or N-type impurities.

A gate insulation layer 112 may be disposed on the active layer 120. The gate insulation layer 112 may be formed on the buffer layer 111 to cover the active layer 120. The gate insulation layer 112 may insulate the gate electrode 130 from the active layer 120. For example, as shown in the exemplary embodiment of FIG. 6, a lower surface of the gate insulation layer 112 may directly contact an upper surface of the buffer layer 111 and upper and side surfaces of the active layer 120. In an exemplary embodiment, the gate insulation layer 112 may include an inorganic insulating material such as at least one compound selected from silicon nitride ($SiN_x$), silicon oxide ($SiO_x$), silicon oxynitride ($SiO_xN_y$), and the like.

The gate electrode 130 may be disposed on the gate insulation layer 112. For example, as shown in the exemplary embodiment of FIG. 6, a lower surface of the gate electrode 130 may directly contact an upper surface of the gate insulation layer 112. The gate electrode 130 may overlap the channel region of the active layer 120 (e.g., in the thickness direction of the substrate 110) with the gate insulation layer 112 therebetween. In an exemplary embodiment, the gate electrode 130 may include a conductive material such as at least one compound selected from molybdenum (Mo), copper (Cu), titanium (Ti), and the like. The gate electrode 130 may have a single-layer structure or a multilayer structure.

An insulation interlayer 113 may be disposed on the gate electrode 130. The insulation interlayer 113 may be formed on the gate insulation layer 112 to cover the gate electrode 130. The insulation interlayer 113 may insulate the first electrode 141 and the second electrode 142 from the gate electrode 130. For example, as shown in the exemplary embodiment of FIG. 6, a lower surface of the insulation interlayer 113 may directly contact an upper surface of the gate insulation layer 112 and upper and side surfaces of the gate electrode 130. In an exemplary embodiment, the insulation interlayer 113 may include an inorganic insulating material such as at least one compound selected from silicon nitride ($SiN_x$), silicon oxide ($SiO_x$), silicon oxynitride ($SiO_xN_y$), and the like.

The first electrode 141 and the second electrode 142 of the transistor TR may be disposed on the insulation interlayer 113 and are spaced apart from each other in a direction parallel to an upper surface of the substrate 110. For example, as shown in the exemplary embodiment of FIG. 6, a lower surface of the first electrode 141 and the second electrode 142 may directly contact an upper surface of the insulation interlayer 113. Anyone of the first electrode 141 and the second electrode 142 may be a source electrode of the transistor TR, and the other of the first electrode 141 and the second electrode 142 may be a drain electrode of the transistor TR. The source electrode and the drain electrode of the transistor TR may be connected to the source region and the drain region of the active layer 120, respectively. The first electrode 141 and the second electrode 142 may be connected to the source region and the drain region of the active layer 120 through contact holes extending through the insulation interlayer 113 and the gate insulation layer 112. In an exemplary embodiment, the first electrode 141 and the second electrode 142 may include a conductive material such as at least one compound selected from aluminum (Al), copper (Cu), titanium (Ti), and the like. The first electrode 141 and the second electrode 142 may have a single-layer structure or a multilayer structure.

A planarization layer 114 may be disposed on the first electrode 141 and the second electrode 142. The planarization layer 114 may be formed on the insulation interlayer 113 to cover the first electrode 141 and the second electrode 142. For example, as shown in the exemplary embodiment of FIG. 6, a lower surface of the planarization layer 114 may directly contact an upper surface of the insulation interlayer 113 and upper and side surfaces of the first electrode 141 and the second electrode 142. The planarization layer 114 may protect the transistor TR, and may provide a planarized surface above the transistor TR. In an exemplary embodiment, the planarization layer 114 may include an inorganic insulating material such as at least one compound selected from silicon nitride (SiN), silicon oxide (Six), silicon oxynitride ($SiO_xN_y$), and the like and/or an organic insulating material such as polyimide (PI) and the like.

The first electrode 150 of the light emitting element EL may be disposed on the planarization layer 114. For example, as shown in the exemplary embodiment of FIG. 6, a lower surface of the first electrode 150 may directly contact an upper surface of the planarization layer 114. The first electrode 150 may be connected to the second electrode 142 of the transistor TR. For example, the first electrode 150 may be connected to the second electrode 142 of the transistor TR through a contact hole formed in the planarization layer 114. In an exemplary embodiment, the first electrode 150 may include a conductive material such as at least one material selected from metal, transparent conductive oxide, and the like. For example, the first electrode 150 may include at least one compound selected from silver (Ag), indium tin oxide (ITO), and the like.

A pixel defining layer 115 may be disposed on the first electrode 150. The pixel defining layer 115 may be formed on the planarization layer 114 to cover the first electrode 150. For example, as shown in the exemplary embodiment of FIG. 6, the pixel defining layer 115 may directly contact an upper surface of the planarization layer 114, side surfaces of the first electrode 150 and lateral edges of the upper surface of the first electrode 150. In an exemplary embodiment, the pixel defining layer 115 may include an organic insulating material such as polyimide (PI) or the like.

An opening exposing at least a portion of an upper surface of the first electrode 150 may be formed in the pixel defining layer 115. As shown in the exemplary embodiment of FIG. 6, the opening may expose a center portion of the upper surface of the first electrode 150, and the pixel defining layer 115 may cover an edge portion of the upper surface of the first electrode 150.

The emission layer 160 may be disposed on the first electrode ISO in the opening of the pixel defining layer 115. For example, as shown in the exemplary embodiment of FIG. 6, a lower surface of the emission layer 160 may directly contact an upper surface of the first electrode 150 and side surfaces of the emission layer may directly contact side surfaces of the pixel defining layer 115. In an exemplary embodiment, the emission layer 160 may include at least one of an organic light emitting material and a quantum dot. However, exemplary embodiments of the present inventive concepts are not limited thereto.

In an exemplary embodiment, the organic light emitting material may include a low molecular organic compound or a high molecular organic compound. For example, the low molecular organic compound may include at least one compound selected from copper phthalocyanine, diphenylbenzidine (N, N-diphenylbenzidine), trihydroxyquinoline aluminum (tris-(8-hydroxyquinoline)aluminum), and the like. The high molecular organic compound may include at least one compound selected from poly ethylenedioxythiophene (poly(3,4-ethylenedioxythiophene), polyaniline, polyphenylenevinylene, polyfluorene, and the like.

In an exemplary embodiment, the quantum dot may include a core including a group II-VI compound, a group III-V compound, a group IV-VI compound, a group IV element, a group IV compound, and a combination thereof. In an exemplary embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 170 of the light emitting element EL may be disposed on the emission layer 160. The second electrode 170 may be formed on the pixel defining layer 115 to cover the emission layer 160. For example, as shown in the exemplary embodiment of FIG. 6, a lower surface of the second electrode 170 may directly contact an upper surface of the emission layer 160 and side and upper surfaces of the pixel defining layer 115. In an exemplary embodiment, the second electrode 170 may include a conductive material such as at least one material selected from metal, transparent conductive oxide, and the like.

For example, the second electrode 170 may include at least one compound selected from aluminum (Al), platinum (Pt), silver (Ag), magnesium (Mg), gold (Au), chromium (Cr), tungsten (W), titanium (Ti), and the like.

Any one of the first electrode 150 and the second electrode 170 may be an anode of the light emitting element EL, and the other of the first electrode 150 and the second electrode 170 may be a cathode of the light emitting element EL. In an exemplary embodiment, the first electrode 150 and the second electrode 170 may be the anode and the cathode of the light emitting element EL, respectively.

The encapsulation layer 200 may be disposed on the display panel 100. The encapsulation layer 200 may cover the light emitting element EL. In an exemplary embodiment, the encapsulation layer 200 may include at least two inorganic encapsulation layers and an organic encapsulation layer disposed between the inorganic encapsulation layers.

For example, as shown in the exemplary embodiment of FIG. 6, the encapsulation layer 200 may include a first inorganic encapsulation layer 210, a second inorganic encapsulation layer 220, and an organic encapsulation layer 230. However, exemplary embodiments of the present inventive concepts are not limited thereto. For example, in another exemplary embodiment, the encapsulation layer 200 may include three or more inorganic encapsulation layers and/or two or more organic encapsulation layers.

The first inorganic encapsulation layer 210 may be disposed on the second electrode 170 of the light emitting element EL. For example, as shown in the exemplary embodiment of FIG. 6, a lower surface of the first inorganic encapsulation layer 210 may directly contact an upper surface of the second electrode 170. The first inorganic encapsulation layer 210 may be formed along a profile of an upper surface of the second electrode 170. In an exemplary embodiment, an upper surface of the first inorganic encapsulation layer 210 may not be planarized.

The second inorganic encapsulation layer 220 may be disposed on the first inorganic encapsulation layer 210. In an exemplary embodiment, the first inorganic encapsulation layer 210 and the second inorganic encapsulation layer 220 may include at least one compound selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like. In an exemplary embodiment, the first inorganic encapsulation layer 210 and the second inorganic encapsulation layer 220 may include the same material. However, exemplary embodiments of the present inventive concepts are not limited thereto and in another exemplary embodiment, the first inorganic encapsulation layer 210 and the second inorganic encapsulation layer 220 may include different materials from each other.

The organic encapsulation layer 230 may be disposed between the first inorganic encapsulation layer 210 and the second inorganic encapsulation layer 220 (e.g., in a thickness direction of the substrate 110). For example, as shown in the exemplary embodiment of FIG. 6, a lower surface of the organic encapsulation layer 230 may directly contact an upper surface of the first inorganic encapsulation layer 210 and an upper surface of the organic encapsulation layer 230 may directly contact a lower surface of the second inorganic encapsulation layer 220. The organic encapsulation layer 230 may have a planarized upper surface (e.g., extending in a direction substantially parallel to an upper surface of the substrate 110). The second inorganic encapsulation layer 220 may be formed along a profile of the upper surface of the organic encapsulation layer 230. Accordingly, an upper surface of the second inorganic encapsulation layer 220 may be planarized by the organic encapsulation layer 230.

The organic encapsulation layer 230 may include a first organic material 231. In an exemplary embodiment, the first organic material 231 may have a permittivity less than or equal to about 3.0. Accordingly, a permittivity of the encapsulation layer 230 may be less than or equal to about 3.0.

In an exemplary embodiment, the first organic material 231 may include at least one material selected from an acryl-based resin, methacryl-based resin, polyisoprene, vinyl-based resin, epoxy-based resin, urethane-based resin, cellulose-based resin, perylene-based resin, and the like. In an exemplary embodiment, the first organic material 231 may be a photocurable material or a thermosetting material.

In an exemplary embodiment, the first organic material 231 may be applied on the first inorganic encapsulation layer 210 by a method such as slit coating, spin coating, spray coating, inkjet printing, or the like. The first organic material 231 may be cured by light or heat to form the organic encapsulation layer 230.

The low permittivity layer 300 may be disposed on the encapsulation layer 200. For example, as shown in the exemplary embodiment of FIG. 6, a lower surface of the low permittivity layer 300 may directly contact an upper surface of the second inorganic encapsulation layer 220. In an exemplary embodiment, the low permittivity layer 300 may include a second organic material 310 and hollow particles 320. The hollow particles 320 may be dispersed in the second organic material 310.

A permittivity of the low permittivity layer 300 may be less than or equal to about 3.0. A permittivity of an organic layer in which hollow particles are dispersed may be less than a permittivity of an organic layer in which the hollow particles are not dispersed. Accordingly, in instances in which a permittivity of the second organic material 310 by itself is greater than about 3.0, the permittivity of the low permittivity layer 300 that includes the hollow particles 320 dispersed in the second organic material 310 may still be less than or equal to about 3.0.

In an exemplary embodiment, the second organic material 310 may include at least one compound selected from acryl, polysiloxane, fluorinated-polysiloxane, polyurethane, fluorinated-polyurethane, polyurethane-acrylate, fluorinated-polyurethane-acrylate, cardo binder, polyimide, polymethylsilsesquioxane (PMSSQ), poly(methyl methacrylate) (PMMA), and PMSSQ-PMMA hybrid.

In an exemplary embodiment, the second organic material 310 may be substantially the same as the first organic material 231 of the organic encapsulation layer 230. Therefore, in this exemplary embodiment, a permittivity of both the first organic material 231 and the second organic material 310 may be less than or equal to about 3.0. However, exemplary embodiments of the present inventive concepts are not limited thereto. For example, in another exemplary embodiment, the second organic material 310 may be different from the first organic material 231. In this exemplary embodiment, the permittivity of the second organic material 310 may be either greater than about 3.0, or less than or equal to about 3.0.

In an exemplary embodiment, the second organic material 310 may be a photocurable material. For example, the second organic material 310 may be cured by irradiation of light such as ultraviolet light or the like. In this exemplary embodiment, the low permittivity layer 300 may further include a photoinitiator. The photoinitiator may initiate a polymerization reaction of the second organic material 310 by absorbing energy from the irradiated light. For example, the low permittivity layer 300 may include at least one of a radical photoinitiator and an ionic photoinitiator.

In another exemplary embodiment, the second organic material 310 may be a thermosetting material. For example, the second organic material 310 may be cured by heat. In this exemplary embodiment, the low permittivity layer 300 may further include a heat stabilizer. The heat stabilizer may improve heat resistance of the second organic material 310. For example, in an exemplary embodiment the heat stabilizer may include at least one compound selected from a phenolic compound, a phosphoric compound, and a thio-based compound.

In an exemplary embodiment, the hollow particles 320 may include at least one compound selected from silica ($SiO_2$), magnesium fluoride ($MgF_2$), and iron oxide ($Fe_3O_4$). As shown in the exemplary embodiment of FIG. 7, each of the hollow particles 320 may include a shell 321 formed of at least one of silica ($SiO_2$), magnesium fluoride ($MgF_2$), and iron oxide ($Fe_3O_4$) and a hollow 322 (e.g., an empty cavity) defined inside the shell 321 and surrounded by the shell 321.

As shown in the exemplary embodiment of FIG. 7, the hollow particles 320 may be substantially circular shaped. However, exemplary embodiments of the present inventive concepts are not limited thereto and the hollow particles 320 may have a variety of different shapes. In an exemplary embodiment, a diameter DIM of each of the hollow particles 320 may be in a range of about 20 nm to about 200 nm. Further, a thickness of the shell 321 may be in a range of about 5 nm to about 20 nm, and a diameter of the hollow 322 may be equal to the difference between the diameter DIM of each of the hollow particles 320 and twice the thickness of the shell 321. The permittivity of the low permittivity layer 300 may decrease as the diameter DIM of each of the hollow particles 320 increases.

The permittivity of the low permittivity layer 300 may decrease as the number of the hollow particles 320 in the low permittivity layer 300 increases. As illustrated in Table 1 below, the permittivity of the low permittivity layer 300 may decrease as a mass ratio of the hollow particles 320 to the total mass of the low permittivity layer 300 increases from 0% to 45%.

TABLE 1

| MASS RATIO OF HOLLOW PARTICLES | 0% | 15% | 30% | 45% |
|---|---|---|---|---|
| PERMITTIVITY OF LOW PERMITTIVITY LAYER | 3.35 | 2.68 | 1.83 | 1.38 |

In an exemplary embodiment, a mass ratio of the hollow particles 320 to the total mass of the low permittivity layer 300 may be in a range of about 10% to about 50%. The permittivity of the low permittivity layer 300 may be greater than about 3.0 when the mass ratio of the hollow particles 320 is less than about 10%. In this case, the permittivity of the low permittivity layer 300 may be greater than the permittivity of the organic encapsulation layer 230. Therefore, the low permittivity layer 300 may not decrease a parasitic capacitance between the display panel 100 and the input sensing layer 400. Further, the number of the hollow particles 320 may be too large when the mass ratio of the hollow particles 320 is greater than about 50%. Therefore, the hollow particles 320 may clump together in the manufacturing process of the low permittivity layer 300 and the permittivity of the low permittivity layer may be greater than about 3.0.

In an exemplary embodiment, the second organic material 310 and the hollow particles 320 may be applied on the encapsulation layer 200 with a method such as slit coating, spin coating, spray coating, inkjet printing, or the like, and the second organic material 310 may be cured by light or heat to form the low permittivity layer 300. However, exemplary embodiments of the present inventive concepts are not limited thereto. For example, in another exemplary embodiment, a film-like structure in which the hollow particles 320 are dispersed in the second organic material 310 may be attached on the encapsulation layer 200 to form the low permittivity layer 300.

In an exemplary embodiment, the permittivity of the first organic material 231 may be less than the permittivity of the second organic material 310. In this exemplary embodiment, the first organic material 231 and the second organic material 310 may be different from each other. Although the permittivity of the second organic material 310 is greater than the permittivity of the first organic material 231, the permittivity of the low permittivity layer 300 may be less than or substantially equal to the permittivity of the organic encapsulation layer 230 because the low permittivity layer 300 includes the hollow particles 320 dispersed in the second organic material 310.

In an exemplary embodiment, a sum of a thickness TH1 (e.g., length in the thickness direction of the substrate 110) of the organic encapsulation layer 230 and a thickness (e.g., length in the thickness direction of the substrate 110) TH2 of the low permittivity layer 300 may be in a range of about 4 μm to about 15 μm. A thickness of the display device 10 (e.g., length in the thickness direction of the substrate 110) may decrease because the sum of the thickness TH1 of the organic encapsulation layer 230 and the thickness TH2 of the low permittivity layer 300 is less than about 15 μm. Accordingly, the display device 10 having a reduced thickness may be easily folded and unfolded.

However, when a thickness of the encapsulation layer 200 and a thickness of the low permittivity layer decreases, a gap between the display panel 100 and the input sensing layer 400 may decrease, and thus, a parasitic capacitance between the display panel 100 and the input sensing layer 400 may increase. For example, a parasitic capacitance between the second electrode 170 of the light emitting element EL of the display panel 100 and the sensing electrodes SE1 and SE2 of the input sensing layer 400 may increase. The parasitic capacitance between the display panel 100 and the input sensing layer 400 may be proportional to the magnitude of noise applied to the input sensing layer 400, and thus, the sensitivity of the input sensing layer 400 may decrease as the parasitic capacitance between the display panel 100 and the input sensing layer 400 increases.

However, in exemplary embodiments of the present inventive concepts, the organic encapsulation layer 230 may include the first organic material 231 having a permittivity less than or equal to about 3.0, and the low permittivity layer 300 may include the hollow particles 320 dispersed in the second organic material 310 and the permittivity of the low permittivity layer 300 may be less than or substantially equal to the permittivity of the organic encapsulation layer 230. Accordingly, the permittivities of the encapsulation layer 200 and the low permittivity layer 300 positioned between the display panel 100 and the input sensing layer 400 may decrease, and thus, the parasitic capacitance between the display panel 100 and the input sensing layer 400 may decrease. Therefore, the sensitivity of the input sensing layer 400 may be improved.

The input sensing layer 400 may be disposed on the low permittivity layer 300. The input sensing layer 400 may include a base layer 410, a bridge 420, an insulation layer 430, a first conductive line 441, and a second conductive line 442. The base layer 410 may include a flexible material or a rigid material. As shown in the exemplary embodiment of FIG. 6, a lower surface of the base layer 410 may directly contact an upper surface of the low permittivity layer 300.

The bridge 420 may be disposed on the base layer 410. For example, as shown in the exemplary embodiment of FIG. 6, a lower surface of the bridge 420 may directly contact an upper surface of the base layer 410. In an exemplary embodiment, the bridge 420 may include a conductive material such as at least one material selected from metal, an alloy thereof, conductive polymer, conductive metal oxide, nano-conductive material, or the like.

The insulation layer 430 may be disposed on the bridge 420. The insulation layer 430 may be formed on the base layer 410 to cover the bridge 420. For example, as shown in the exemplary embodiment of FIG. 6, a lower surface of the insulation layer 430 may directly contact an upper surface of the base layer 410 and upper and side surfaces of the bridge 420. In an exemplary embodiment, the insulation layer 430 may be an inorganic insulation layer formed of an inorganic insulating material. For example, the insulation layer 430 may be formed of at least one compound selected from polysiloxane, silicon nitride, silicon oxide, silicon oxynitride, and the like. However, exemplary embodiments of the present inventive concepts are not limited thereto. For example, in another exemplary embodiment, the insulation layer 430 may be an organic insulation layer formed of an organic material. For example, the insulation layer 430 may be formed of at least one compound selected from polyacrylate compound, polyimide-based compound, fluoride carbide compound, benzocyclobutene compound, and the like.

The first conductive line 441 and the second conductive line 442 may be disposed on the insulation layer 430. For example, as shown in the exemplary embodiment of FIG. 6, a lower surface of the first conductive line 441 and the second conductive line 442 may directly contact an upper surface of the insulation layer 430. In an exemplary embodiment, the first conductive line 441 may form the first sensing electrode SE1, and the second conductive line 442 may form the second sensing electrode SE2. The first conductive line 441 may be disconnected at an intersecting area of the first conductive line 441 and the second conductive line 442 to insulate the first conductive line 441 and the second conductive line 442 from each other which are disposed on the same layer. Disconnected portions of the first conductive line 441 may be connected through the bridge 420 disposed on a different layer (e.g., the base layer 410) from the first conductive line 441 and the second conductive line 442.

In an exemplary embodiment, the first conductive line 441 and the second conductive line 442 may include a conductive material such as at least one material selected from metal, an alloy thereof, conductive polymer, conductive metal oxide, nano-conductive material, and the like. The first conductive line 441 and the second conductive line 442 may include a material substantially the same as or different from that of the bridge 420.

Figure 8:
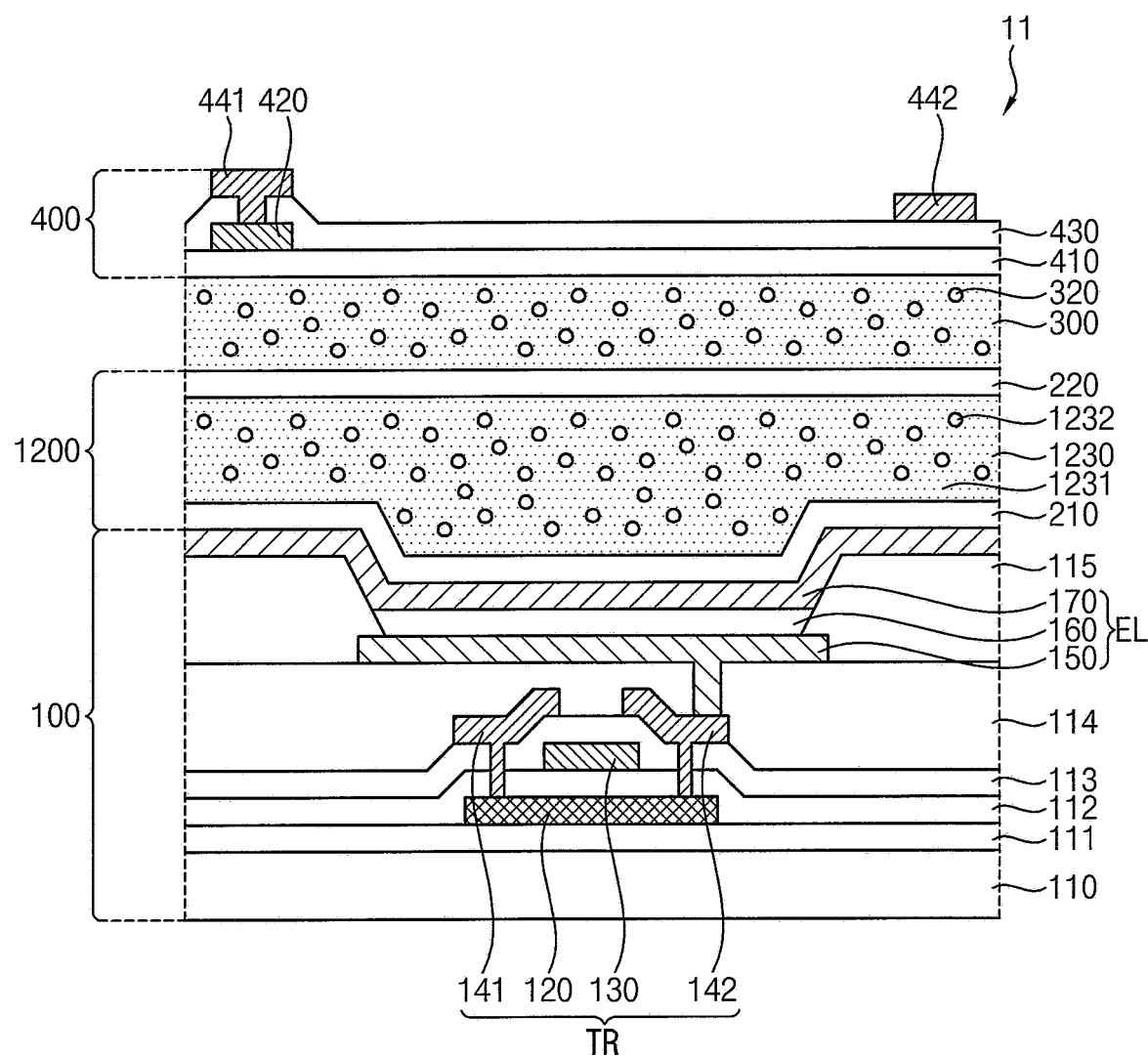
FIG. 8 is a cross-sectional view illustrating a display device according to an exemplary embodiment of the present inventive concepts.

FIG. 8 is a cross-sectional view illustrating a display device 11 according to an exemplary embodiment of the present inventive concepts.

Referring to the exemplary embodiment of FIG. 8, a display device 11 may include a display panel 100, an encapsulation layer 1200, a low permittivity layer 300, and an input sensing layer 400. The display device 11 described with reference to the exemplary embodiment of FIG. 8 may be substantially the same as or similar to the display device 10 described with reference to the exemplary embodiment of FIG. 6 except for an organic encapsulation layer 1230 of the encapsulation layer 1200. Accordingly, descriptions on repeated elements may be omitted for convenience of explanation.

The organic encapsulation layer 1230 may include a first organic material 1231 and hollow particles 1232. The hollow particles 1232 may be dispersed in the first organic material. The hollow particles 1232 may be substantially the same as the hollow particles 320 of the low permittivity layer 300 as previously described.

A permittivity of the organic encapsulation layer 1230 may be less than or equal to about 3.0. A permittivity of an organic layer in which hollow particles are dispersed may be less than a permittivity of an organic layer in which the hollow particles are not dispersed. Therefore, in the exemplary embodiment of FIG. 8, the permittivity of the first organic material 1231 may be greater than about 3.0 in contrast with the permittivity of the first organic material 231 in the exemplary embodiment of FIG. 6. However, exemplary embodiments of the present inventive concepts are not limited thereto and in some exemplary embodiments the first organic material 1231 may have a permittivity of about 3.0 or less. However, even in instances in which a permittivity of the first organic material 1231 by itself is greater than about 3.0, the permittivity of the organic encapsulation layer 1230 that includes the hollow particles 1232 may still be less than or equal to about 3.0 due to the hollow particles 1232.

In an exemplary embodiment, the first organic material 1231 may include at least one compound selected from acryl, polysiloxane, fluorinated-polysiloxane, polyurethane, fluorinated-polyurethane, polyurethane-acrylate, fluorinated-polyurethane-acrylate, cardo binder, polyimide, polymethylsilsesquioxane (PMSSQ), poly(methyl methacrylate) (PMMA), and PMSSQ-PMMA hybrid.

In an exemplary embodiment, the first organic material 1231 may be a photocurable material. In this exemplary embodiment, the organic encapsulation layer 1230 may further include a photoinitiator. The photoinitiator may initiate polymerization reaction of the first organic material 1231 by absorbing energy from light. In another exemplary embodiment, the first organic material 1231 may be a thermosetting material. In this exemplary embodiment, the organic encapsulation layer 1230 may further include a heat stabilizer. The heat stabilizer may improve heat resistance of the first organic material 1231.

In an exemplary embodiment, the hollow particles 1232 may include at least one compound selected from silica ($SiO_2$), magnesium fluoride ($MgF_2$), and iron oxide ($Fe_3O_4$). As described previously with respect to Table 1, the permittivity of the organic encapsulation layer 1230 may decrease as the amount of the hollow particles 1232 in the organic encapsulation layer 1230 increases.

In an exemplary embodiment, amass ratio of the hollow particles 1232 to the total mass of the organic encapsulation layer 1230 may be in a range of about 10% to about 50%. The permittivity of the organic encapsulation layer 1230 may be greater than about 3.0 when the mass ratio of the hollow particles 1232 is less than about 0/o. Further, the number of the hollow particles 1232 may excessively increase when the mass ratio of the hollow particles 1232 is greater than about 50%, and thus, the hollow particles 1232 may clump together in the manufacturing process of the organic encapsulation layer 1230 and the permittivity of the organic encapsulation layer 1230 may be greater than about 3.0.

Figure 9:
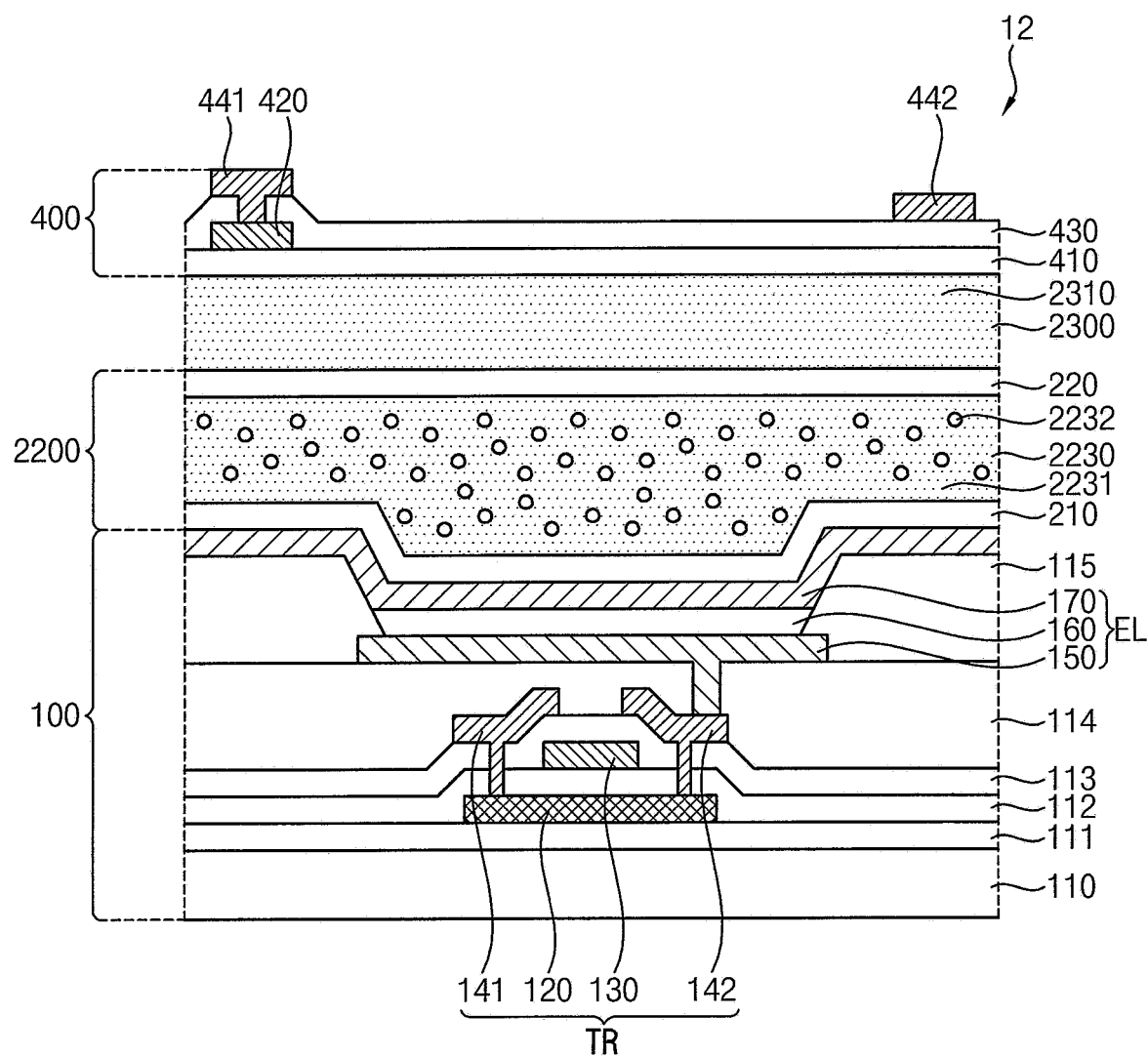
FIG. 9 is a cross-sectional view illustrating a display device according to an exemplary embodiment of the present inventive concepts.

FIG. 9 is a cross-sectional view illustrating a display device 12 according to an exemplary embodiment of the present inventive concepts.

Referring to the exemplary embodiment of FIG. 9, a display device 12 may include a display panel 100, an encapsulation layer 2200, a low permittivity layer 2300, and an input sensing layer 400. The display device 12 described with reference to the exemplary embodiment of FIG. 9 may be substantially the same as or similar to the display device 10 described with reference to FIG. 6 except for an organic encapsulation layer 2230 of the encapsulation layer 2200 and the low permittivity layer 2300. Accordingly, descriptions on repeated elements may be omitted for convenience of explanation.

The organic encapsulation layer 2230 may include a first organic material 2231 and hollow particles 2232. The hollow particles 2232 may be dispersed in the first organic material 2231. A permittivity of the organic encapsulation layer 2230 may be less than or equal to about 3.0. The organic encapsulation layer 2230 described with reference to the exemplary embodiment of FIG. 9 may be substantially the same as or similar to the organic encapsulation layer 1230 described with reference to the exemplary embodiment of FIG. 8. Accordingly, repeated descriptions on the organic encapsulation layer 2230 may be omitted for convenience of explanation.

The low permittivity layer 2300 may include a second organic material 2310. The low permittivity layer 2300 may not include hollow particles 320. The second organic material may have a permittivity less than or equal to about 3.0. Accordingly, a permittivity of the low permittivity layer 2300 may be less than or equal to about 3.0.

In an exemplary embodiment, the second organic material may include at least one material selected from acryl-based resin, methacryl-based resin, polyisoprene, vinyl-based resin, epoxy-based resin, urethane-based resin, cellulose-based resin, perylene-based resin, and the like. The second organic material may be a photocurable material or a thermosetting material.

In an exemplary embodiment, the permittivity of the second organic material 2310 included in the low permittivity layer 2300 may be less than the permittivity of the first organic material 2231 included in the organic encapsulation layer 2230. In this exemplary embodiment, the first organic material and the second organic material may be different from each other. Although the permittivity of the first organic material 2231 is greater than the permittivity of the second organic material 2310, the permittivity of the organic encapsulation layer 2230 may be less than or substantially equal to the permittivity of the low permittivity layer 2300 because the organic encapsulation layer 2230 includes the hollow particles 2232 dispersed in the first organic material 2231.

Figure 10:
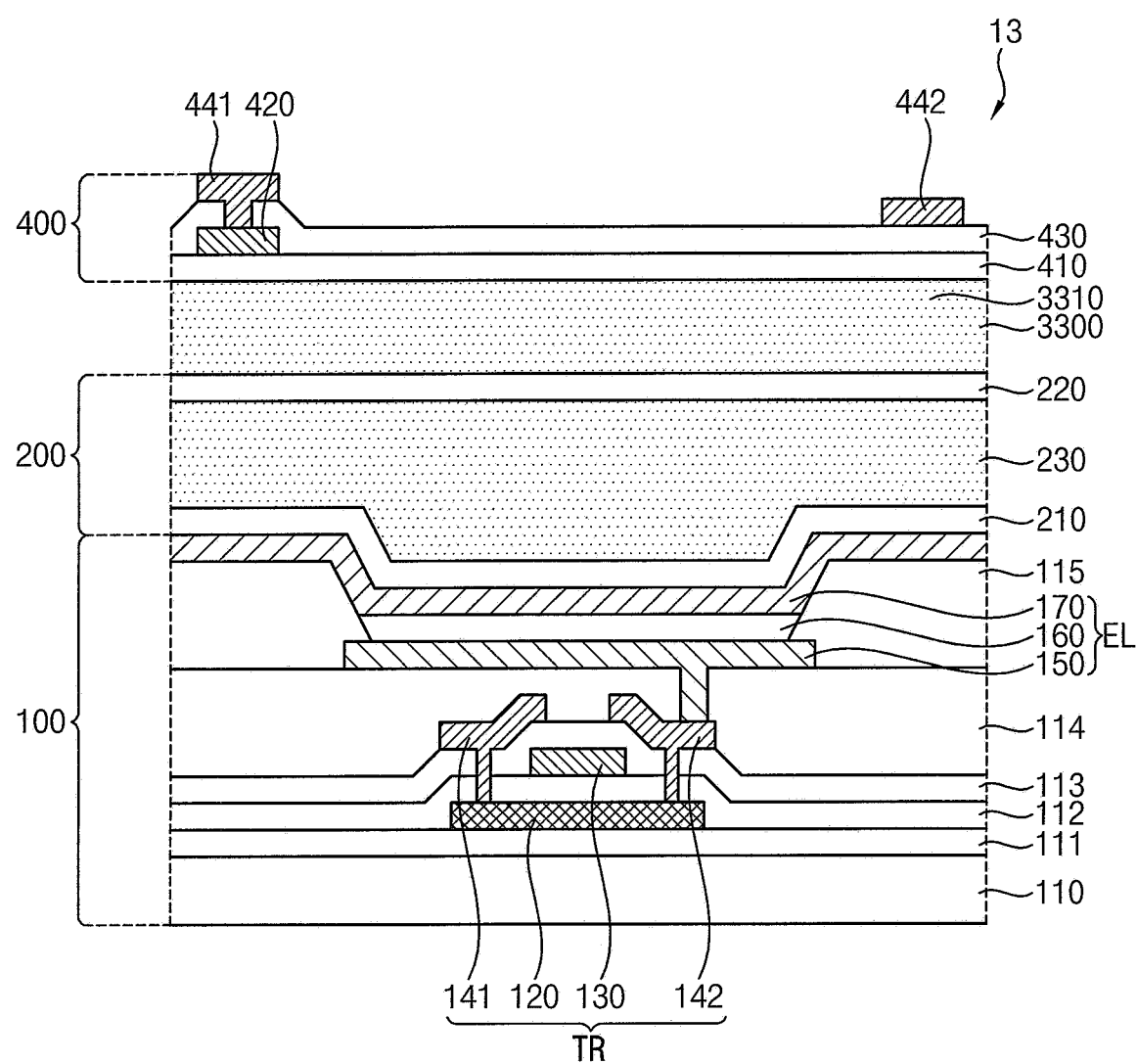
FIG. 10 is a cross-sectional view illustrating a display device according to an exemplary embodiment of the present inventive concepts.

FIG. 10 is a cross-sectional view illustrating a display device 13 according to an exemplary embodiment of the present inventive concepts.

Referring to the exemplary embodiment of FIG. 10, a display device 13 may include a display panel 100, an encapsulation layer 200, a low permittivity layer 3300, and an input sensing layer 400. The display device 13 described with reference to the exemplary embodiment of FIG. 10 may be substantially the same as or similar to the display device 10 described with reference to the exemplary embodiment of FIG. 6 except for the low permittivity layer 3300. Accordingly, descriptions on repeated elements may be omitted for convenience of explanation.

The low permittivity layer 3300 may include a second organic material 3310. The second organic material 3310 may have a permittivity less than or equal to about 3.0. Accordingly, a permittivity of the low permittivity layer 3300 may be less than or equal to about 3.0. The low permittivity layer 3300 described with reference to the exemplary embodiment of FIG. 10 may be substantially the same as or similar to the low permittivity layer 2300 described with reference to the exemplary embodiment of FIG. 9. Accordingly, repeated descriptions on the low permittivity layer 3300 may be omitted.

In the exemplary embodiment of FIG. 10, both the first organic material 231 of the organic encapsulation layer 230 and the second organic material 3310 of the low permittivity layer 3300 may have a permittivity that is less than or equal to about 3.0. Therefore, both the organic encapsulation layer 230 and the low permittivity layer 3300 may not include hollow particles 320 and the permittivities of both the organic encapsulation layer 230 and the low permittivity layer 3300 may still be less than or equal to about 3.0.

The display device according to the embodiments may be applied to a display device included in a computer, a notebook, a mobile phone, a smartphone, a smart pad, a PMP, a PDA, an MP3 player, or the like. However, exemplary embodiments of the present inventive concepts are not limited thereto and the display device may be included in other large, medium or small electronic devices.

Although the display device according to the exemplary embodiments have been described with reference to the drawings, the illustrated embodiments are examples, and may be modified and changed by a person having ordinary knowledge in the relevant technical field without departing from the present inventive concepts.

What is claimed is:
1. A display device, comprising:
a substrate;
a light emitting element disposed on the substrate;
an encapsulation layer covering the light emitting element, the encapsulation layer including at least two inorganic encapsulation layers and at least one organic encapsulation layer, the at least one organic encapsulation layer including a first organic material having a permittivity less than or equal to about 3.0;
a low permittivity layer disposed on the encapsulation layer, the low permittivity layer including a second organic material and first hollow particles dispersed in the second organic material; and
an input sensing layer disposed on the low permittivity layer,
wherein the low permittivity layer is disposed between the light emitting element and the input sensing layer in a thickness direction of the substrate.

2. The display device of claim 1, wherein a permittivity of the low permittivity layer is less than or equal to about 3.0.

3. The display device of claim 1, wherein a mass ratio of the first hollow particles to a total mass of the low permittivity layer is in a range of about 10% to about 50%.

4. The display device of claim 1, wherein the first hollow particles include at least one compound selected from silica ($SiO_2$), magnesium fluoride ($MgF_2$), and iron oxide ($Fe_3O_4$).

5. The display device of claim 1, wherein a diameter of each of the first hollow particles is in a range of about 20 nm to about 200 nm.

6. The display device of claim 1, wherein the second organic material is a same material as the first organic material.

7. The display device of claim 1, wherein the second organic material is a different material than the first organic material.

8. The display device of claim 1, wherein the second organic material is a photocurable material.

9. The display device of claim 8, wherein the low permittivity layer further includes a photoinitiator.

10. The display device of claim 1, wherein the second organic material is a thermosetting material.

11. The display device of claim 10, wherein the low permittivity layer further includes a thermostabilizer.

12. The display device of claim 1, wherein the permittivity of the first organic material is less than a permittivity of the second organic material.

13. The display device of claim 1, wherein the at least one organic encapsulation layer further includes second hollow particles dispersed in the first organic material.

14. The display device of claim 1, wherein a sum of a thickness of the at least one organic encapsulation layer and a thickness of the low permittivity layer is in a range of about 4 μm to about 15 μm.

15. The display device of claim 1, wherein the light emitting element includes:
a first electrode disposed on the substrate;
an emission layer disposed on the first electrode; and
a second electrode disposed on the emission layer.

16. The display device of claim 1, wherein the input sensing layer includes a first sensing electrode and a second sensing electrode insulated from each other.

17. The display device of claim 1, wherein the first hollow particles include a shell and an empty cavity defined inside the shell.

18. A display device, comprising:
a substrate;
a light emitting element disposed on the substrate;
an encapsulation layer covering the light emitting element, the encapsulation layer including at least two inorganic encapsulation layers and at least one organic encapsulation layer, the at least one organic encapsulation layer including a first organic material and hollow particles dispersed in the first organic material;

a low permittivity layer disposed on the encapsulation layer, the low permittivity layer, including a second organic material having a permittivity less than or equal to about 3.0; and an input sensing layer disposed on the low permittivity layer, wherein the low permittivity layer is disposed between the light emitting element and the input sensing layer in a thickness direction of the substrate.

19. The display device of claim 18, wherein a permittivity of the at least one organic encapsulation layer is less than or equal to about 3.0.

20. The display device of claim 18, wherein the permittivity of the second organic material is less than a permittivity of the first organic material.

21. The display device of claim 18, wherein the hollow particles include a shell and an empty cavity defined inside the shell.

22. A display device, comprising:

a substrate;

a light emitting element disposed on the substrate;

an encapsulation layer covering the light emitting element, the encapsulation layer including at least two inorganic encapsulation layers and at least one organic encapsulation layer, the at least one organic encapsulation layer including a first organic material having a permittivity less than or equal to about 3.0;

a low permittivity layer disposed on the encapsulation layer, the low permittivity layer including a second organic material having a permittivity less than or equal to about 3.0; and an input sensing layer disposed on the low permittivity layer, wherein the low permittivity layer is disposed between the light emitting element and the input sensing layer in a thickness direction of the substrate.

* * * * *